United States Patent
Li et al.

(10) Patent No.: US 8,928,365 B2
(45) Date of Patent: Jan. 6, 2015

(54) METHODS AND DEVICES FOR MATCHING TRANSMISSION LINE CHARACTERISTICS USING STACKED METAL OXIDE SEMICONDUCTOR (MOS) TRANSISTORS

(71) Applicant: QUALCOMM Incorporated, San Diego, CA (US)

(72) Inventors: Miao Li, San Diego, CA (US); Jingcheng Zhuang, San Diego, CA (US); Yan Hu, San Diego, CA (US); Xiaoliang Bai, San Diego, CA (US); Jing Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/658,778

(22) Filed: Oct. 23, 2012

(65) Prior Publication Data

US 2014/0111250 A1 Apr. 24, 2014

(51) Int. Cl.
*H03K 3/00* (2006.01)
(52) U.S. Cl.
USPC .......................................... 327/112; 327/538
(58) Field of Classification Search
USPC ......................................................... 327/112
See application file for complete search history.

(56) References Cited

U.S. PATENT DOCUMENTS

| | | | |
|---|---|---|---|
| 5,404,057 A | 4/1995 | Hasegawa | |
| 6,111,431 A * | 8/2000 | Estrada | 326/83 |
| 6,380,797 B1* | 4/2002 | Macaluso et al. | 327/513 |
| 6,975,141 B2* | 12/2005 | Mueller et al. | 326/83 |
| 7,027,276 B2 | 4/2006 | Chen | |
| 7,304,827 B2 | 12/2007 | Chen et al. | |
| 7,619,448 B2* | 11/2009 | Wu et al. | 327/108 |
| 7,791,852 B2 | 9/2010 | Otsuka et al. | |
| 7,880,512 B2* | 2/2011 | Takeuchi | 327/108 |
| 7,898,295 B1* | 3/2011 | Kasturirangan et al. | 326/86 |
| 8,030,968 B1 | 10/2011 | Avner et al. | |
| 8,466,718 B2* | 6/2013 | Ezumi et al. | 327/108 |
| 8,466,982 B2* | 6/2013 | Liu et al. | 348/222.1 |
| 2005/0007150 A1* | 1/2005 | Omote | 326/83 |
| 2007/0279105 A1* | 12/2007 | Sunairi | 327/108 |
| 2011/0248749 A1* | 10/2011 | Ezumi et al. | 327/108 |
| 2012/0299616 A1* | 11/2012 | Liu et al. | 326/29 |

OTHER PUBLICATIONS

International Search Report and Written Opinion—PCT/US2013/065592—ISA/EPO—Mar. 19, 2014.

* cited by examiner

*Primary Examiner* — Ryan Jager
(74) *Attorney, Agent, or Firm* — Paul S. Holdaway

(57) ABSTRACT

An output driver for electrostatic discharge (ESD) protection includes a first pair of stacked metal oxide semiconductor field-effect transistor (MOS) devices coupled between a power terminal and a first differential output terminal. The output driver also includes a second pair of stacked MOS devices coupled between a second differential output terminal and a ground terminal.

21 Claims, 5 Drawing Sheets

METHODS AND DEVICES FOR MATCHING TRANSMISSION LINE CHARACTERISTICS USING STACKED METAL OXIDE SEMICONDUCTOR (MOS) TRANSISTORS

TECHNICAL FIELD

The present disclosure relates generally to voltage-mode drivers. More specifically, the disclosure relates methods and devices for matching transmission line characteristics using stacked MOS transistors.

BACKGROUND

When electrostatic discharge (ESD) flows into an integrated semiconductor chip, internal circuits in the semiconductor chip may be damaged or malfunction. The ESD mainly flows into the input/output driver stages. Conventionally, input protection circuits may be employed at an input driver stage to accommodate electrostatic discharge flows. Similar input protection circuits, however, might not be employed at an output driver stage because design constraints do not permit the use of a resistance between an output buffer and an interface terminal. Further, output driver designs are specified to meet certain minimum ESD specifications.

SUMMARY

According to one aspect of the present disclosure, an output driver is described. The output driver includes a first pair of stacked metal oxide semiconductor field-effect transistor (MOS) devices coupled between a power terminal and a first differential output terminal. The output driver further includes a second pair of stacked MOS devices coupled between a second differential output terminal and a ground terminal.

According to another aspect of the present disclosure, a method of operating an output driver is described. The method includes generating a first bias voltage for a first pair of stacked MOS devices coupled between a power terminal and a first differential output terminal to match a first transmission line characteristic. The method also includes generating a second bias voltage for a second pair of stacked MOS devices coupled between a second differential output terminal and a ground terminal to match a second transmission line characteristic.

According to a further aspect of the present disclosure, an output driver is described. The output driver includes a first means for switching electronic signals stacked on a second means for switching electronic signals. The first and second switching means are coupled between a power terminal and a first differential output terminal. The output driver also includes a third means for switching electronic signals stacked on a fourth means for switching electronic signals. The third and fourth switching means are coupled between a second differential output terminal and a ground terminal.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

The features, nature, and advantages of the present disclosure will become more apparent from the detailed description set forth below when taken in conjunction with the drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Aspects of the present disclosure may include an improved output driver and an improved method of ESD protection for the output driver.

In particular, some aspects of the disclosure generate an on resistance (Ron) substantially equal to an impedance characteristic of a transmission line, while satisfying electrostatic discharge specifications for an output buffer design. One aspect of the present disclosure generates an on resistance of 50 Ohms with a stack of transistors (e.g., n-type metal oxide semiconductor field-effect transistors (NMOS transistors)) that matches a transmission line impedance characteristic. The stacked NMOS transistors include more than one transistor arranged between a differential output terminal of a voltage mode driver and a power source of an output buffer. The stacked NMOS transistors also include more than one transistor arranged between the differential output terminal of the voltage mode driver and a ground terminal of the output buffer.

Figure 1:
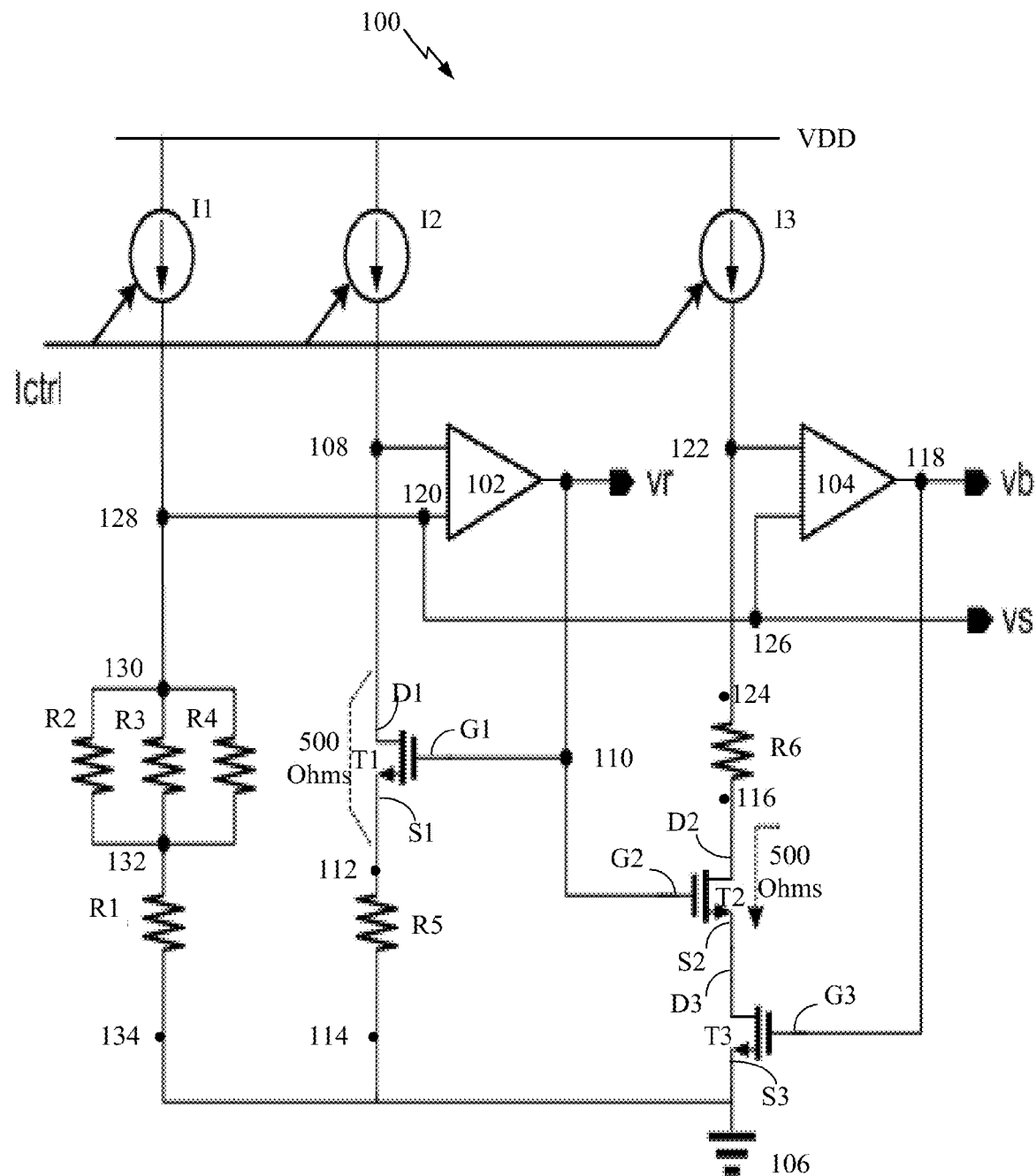
FIG. 1 illustrates an exemplary replica circuitry of a voltage mode driver according to an aspect of the present disclosure.
Figure 2:
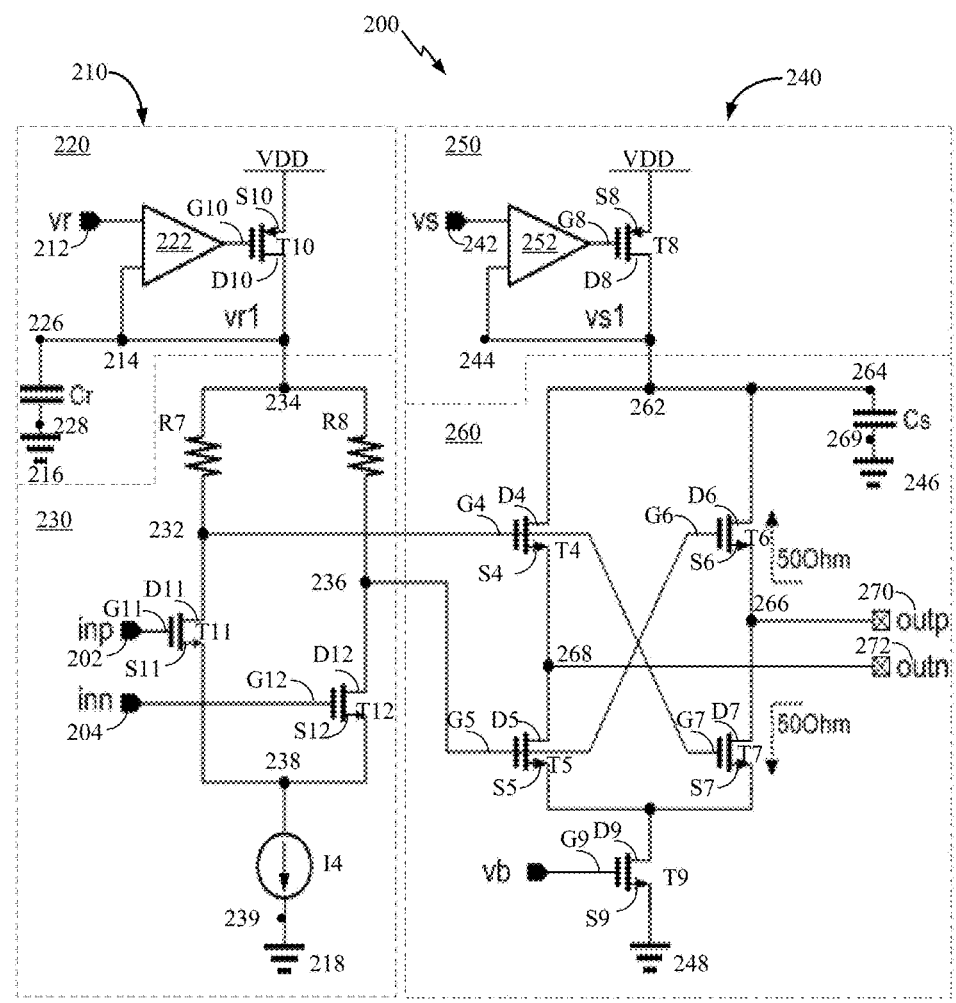
FIG. 2 is a schematic diagram illustrating an exemplary voltage-mode driver including stacked NMOS transistors according to an aspect of the present disclosure.

Referring to FIGS. 1 and 2, replica circuitry 100 of a voltage mode driver 200 is illustrated, according to one aspect of the present disclosure. The voltage mode driver 200 replicates currents/voltages/impedances (or scaled versions thereof) provided by the replica circuitry 100. Based on the currents/voltages/impedances (or scaled versions thereof) provided by the replica circuitry 100, the voltage mode driver 200 is configured to control an output impedance associated with an output driver circuit 260 of an output driver stage 240.

In this configuration, the replica circuitry 100 includes first, second and third circuit portions. The first circuit portion includes a first current source I1, and resistors R1, R2, R3, and R4. The second circuit portion includes a second current source I2, an operational amplifier 102, a transistor T1 and a resistor R5. The third circuit portion includes a third current source I3, an operational amplifier 104, a second driver transistor T2, a third driver transistor T3, and a resistor R6. In the third circuit portion, the transistors T2 and T3 are arranged in a stacked configuration. The transistors T1, T2 and/or T3 may be NMOS transistors.

In the configuration shown in FIG. 1, each of the current sources is coupled to a voltage source VDD and controlled by a programmable current control source Ictrl. In particular, each input of the current sources I1, I2, and I3 is coupled to the power source VDD. In one configuration, the current sources I1, I2, and I3 generate substantially the same output current. Each of the first, second and third circuit portions is coupled to a ground terminal 106. The operational amplifiers 102 and 104 may output a voltage (e.g., Vr or Vb) for the replica circuitry 100. In this configuration, a desired resistance of the replica circuitry 100 is achieved based on the voltages.

In FIG. 1, a voltage at a drain D1 of the transistor T1 is defined by a product of the output current from the second current source I2 and the combination of the impedance at the transistor T1 and the resistance of the resistor R5. As noted, the second current source I2 is coupled to the programmable current control source Ictrl to control the current sources I1, I2, and I3. A gate G1 of the transistor T1 is coupled to an output of the operational amplifier 102 at terminal 110. The voltage at the terminal 110 may be equivalent to the output voltage Vr of the operational amplifier 102. A source S1 of the transistor T1 is coupled to a terminal 112 of the resistor R5. A terminal 114 of the resistor R5 is coupled to a ground terminal 106. A second input terminal 120 of the operational amplifier 102 may be coupled to a terminal 128 of the first circuit portion. The voltage at the terminal 128 is Vs. A first input terminal 108 of the operational amplifier 102 is coupled to the output of the second current source I2.

As further shown in FIG. 1, a drain D2 of a transistor T2 is coupled to a terminal 116 of the resistor R6. A voltage at a terminal 124 of the resistor R6 is defined by a product of an output current from the third current source I3, the combination of the impedances at the transistor T2 and T3 and the resistance of the resistor R6. A gate G2 of the transistor T2 is coupled to the output of the operational amplifier 102 at terminal 110. The voltage at terminal 110 is equivalent to the output voltage Vr of the operational amplifier 102. A source S2 of the transistor T2 is coupled to a drain (D3) of a transistor T3. A gate G3 of the transistor T3 is coupled to an output of the operational amplifier 104 at a terminal 118. The voltage at the output of the operational amplifier is Vb. A source S3 of the transistor T3 is coupled to the ground terminal 106. A second input terminal 126 of the operational amplifier 104 is coupled to the terminal 128 of the first circuit portion through the second input terminal 120 of the operational amplifier 102. The voltage Vs at the second input terminal 126 is equal to the voltage defined at the terminal 128 and the second input terminal 120. A first input terminal 122 of the operational amplifier 104 is coupled to the output of the third current source I3.

In the configuration of FIG. 1, the supply voltage Vs is the supply voltage for both the second input terminal 120 and the second input terminal 126 of the operational amplifiers 102 and 104, respectively. In particular, a current generated by the first current source I1, and the resistors R1, R2, R3, and R4 defines the supply voltage Vs at the terminal 128. The voltage at a terminal 130, associated with the resistors R2, R3, and R4, is equal to Vs. In one aspect of the disclosure, the resistors R2, R3, and R4 are arranged in a parallel configuration. The resistor R1 may be coupled in series with the parallel resistors R2, R3, and R4. The first current source I1 is coupled to terminal 128. A terminal 132 is a shared terminal of the resistors R1, R2, R3, and R4. A terminal 134 of the resistor R1 is coupled to the ground terminal 106.

In one configuration, the resistors R1, R2, R3, and R4 are calibrated to a predetermined value (e.g., R1 equals 1.5 kilo (1.5K) Ohms) and the resistance of the combination of the parallel resistors R2, R3, and R4 is calibrated to 500 Ohms. Calibrating the resistors R1, R2, R3, and R4 maintain a consistent resistance across the resistors R1, R2, R3, and R4 over temperature, power and voltage changes.

In one aspect of the present disclosure, the resistor R5 corresponds to the calibrated resistance R1, and the impedance across the transistor T1 corresponds to the resistance across the parallel resistors R2, R3, and R4. In particular, the resistor R5 is equal to 1.5K Ohms or substantially equal to the resistance of R1, and the impedance of the transistor T1 is 500 Ohms or substantially equal to the resistance across the parallel resistors R2, R3, and R4. Therefore, the total resistance from the terminal 128 to the ground terminal 106 is equal or substantially equal to the total resistance from the first input terminal 108 to the ground terminal 106. Because the current through the first input terminal 108 and the terminal 128 is also equal (i.e., the current from I1 equals the current from I2), the voltages at the first input terminal 108 and the terminal 128 are also equal. Because the voltage defined at the terminal 128 is the same as the voltage at the second input terminal 120 when the transistor T1 is on, the input voltages at the first input terminal 108 and the second input terminal 120 of the operational amplifier 102 are also the same when transistor T1 is active. If any difference arises, the circuit works to make the input voltages the same.

Similarly, the resistor R6 corresponds to the calibrated resistance R1, and the sum of the impedance across the transistors T2 and T3 corresponds to the resistance across the parallel resistors R2, R3, and R4. In particular, the resistor R6 is equal to 1.5K Ohms or substantially equal to the resistance of R1, and the sum of the impedance of the transistors T2 and T3 is 500 Ohms or substantially equal to the resistance across the parallel resistors R2, R3, and R4. Therefore, the total resistance from the terminal 128 to the ground terminal 106 is equal or substantially equal to the total resistance from the first input terminal 122 to the ground terminal 106. Because the current through the terminal 128 and the first input terminal 122 is equal (i.e., the current from the current source I1 equals the current from the current source I3), the voltages at the terminal 128 and the first input terminal 122 and are also equal. Because the voltage defined at the terminal 128 is the same as the voltage defined at the first input terminal 122, the input voltages at the first input terminal 122 and the first input terminal 122 of the operational amplifier 104 are the same.

The transistors T1, T2, and T3 may be biased to their respective impedances by bias voltages Vr and Vb generated by the operational amplifiers 102 and 104. In particular, the output voltage Vr loops back from the output of the operational amplifier 102 to bias the transistors T1 and T2 to their respective impedances, and the output from the operation amplifier 104 biases the transistor T3. In addition, the bias voltages Vr and Vb may be varied such that the impedance of the transistors T1, T2, and T3 correspond to the respective calibrated resistances of the first circuit configuration.

FIG. 2 is a schematic diagram illustrating a voltage mode driver 200 including stacked NMOS transistors according to an aspect of the present disclosure. As noted, the voltage mode driver 200 of FIG. 2 replicates currents/voltages/impedances (or scaled versions thereof) provided by the replica circuitry 100 of FIG. 1. The transistors T1, T2, and T3 of the replica circuitry 100 have a ratio of 1:10 with respect to the impedance characteristic of the respective transistors T4, T5, T6, T7, and T9 of the voltage mode driver 200 of FIG. 2. For example, although the replica circuitry 100 of FIG. 1 generates an impedance of 500 Ohms across the transistor T1 and across the combination of transistors T2 and T3, the total impedance generated across the corresponding transistor T4 or T6 or the corresponding combination of transistors T5 and T9 or T7 and T9 at the output driver stage 240 of FIG. 2 is 50 Ohms. That is, the 50 Ohm impedance at the output driver stage 240 is due to the 1:10 impedance ratio between the transistors of the replica circuitry 100 and the transistors of the voltage mode driver 200.

In this configuration, the total impedance at the output driver stage 240 is 50 Ohms because the output driver stage 240 of the voltage mode driver 200 is implemented with transistors T4, T5, T6, T7 and T9 that have a ratio of 10:1 with respect to the impedance characteristic of the respective transistors T1, T2, and T3 of the replica circuitry 100. As a result, a single-ended output resistance of the voltage mode driver 200 of FIG. 2 is 50 Ohms (e.g., 500/10 Ohms due to the 10:1 ratio). In this configuration, the total impedance (e.g., 50 Ohms) matches the impedance of a transmission line associated with the voltage mode driver 200.

As shown in FIG. 2, the voltage mode driver 200 selectively couples to transmission lines via differential output terminals, outp 270 and outn 272. The transmission lines may have a characteristic impedance of 50 Ohms. In this configuration, the voltage mode driver 200 includes a pre-driver stage 210 and an output driver stage 240. The pre-driver stage 210 includes a first power rail circuit 220 and a pre-driver circuit 230. The output driver stage 240 includes a second power rail circuit 250 and an output driver circuit 260.

In one aspect of the present disclosure, the replica circuitry 100 of FIG. 1 controls the pre-driver stage 210, and the pre-driver stage controls the output impedance of the output driver stage 240. In this configuration, the replica circuitry 100 generates a voltage Vr for the pre-driver stage 210. An output voltage swing of the pre-driver stage 210 is set by the supply voltage Vr. In particular, the pre-driver stage 210 toggles between, for example, 0 volts and a real voltage, such as the voltage Vr. An upper rail of the pre-driver stage output is Vr1 (i.e., the voltage defined at the second input terminal 214 and at a drain D10 of a transistor T10) which is equal to Vr. In particular, the output voltage Vr1 loops back from the drain D10 of the transistor T10 to a second input terminal 214 of an operational amplifier 222. A tail current from pre-driver stage 210 may be adjusted with the current source I4 to control the output voltage swing.

In this configuration, the first power rail circuit 220 includes the operational amplifier 222, a power source VDD and the transistor T10. A source S10 of the transistor T10 is coupled to the power source VDD, a gate G10 is coupled to an output of the operational amplifier 222, and a drain D10 is coupled to a terminal 234. A first terminal 226 of a capacitor Cr is coupled to the terminal 234 and a second terminal 228 of the capacitor Cr is coupled to a direct current ground terminal 216. A first input terminal 212 of the operational amplifier 222 receives first the voltage Vr generated by the replica circuitry 100. In this configuration, an output swing of the pre-driver circuit 230 is set by the supply voltage Vr generated by the replica circuitry 100. A second input terminal 214 of the operational amplifier 222 is coupled to the drain D10 to receive a voltage defined at the drain D10.

The pre-driver circuit 230 may be based on a current-mode logic structure. Representatively, the pre-driver circuit 230 may include transistors T11 and T12, resistors R7 and R8, a ground terminal 218 and a current source I4. A source S11 of the transistor T11 is coupled to a terminal 238 of the current source I4; a gate G11 is coupled to a differential input terminal, inp 202; and a drain D11 is coupled to a terminal 232 between the resistor R7 and the drain D11. A terminal 239 of the current source I4 is coupled to a ground terminal 218. A source S12 of a transistor T12 is coupled to the terminal 238 of the current source I4; a gate G12 is coupled to a differential input terminal, inn 204; and a drain D12 is coupled to a terminal 236. Each of the resistors R7 and R8 may be coupled to the terminal 234. A resistance value of the resistors R7 and R8 may be approximately 200 ohms. The differential input terminals (inp 202 and inn 204) receive differential input signals. In one aspect of the disclosure, the transistor T10 is a p-type metal oxide semiconductor field-effect transistor (PMOS transistor) and the transistors T11 and T12 are NMOS transistors. In operation, transistors T10, T11 and T12 may have an increased impedance as a result of operating in a saturation state.

As shown in FIG. 2, the voltage mode driver 200 also includes a second power rail circuit 250 and an output driver circuit 260. In one aspect of the disclosure, the second power rail circuit 250 includes an operational amplifier 252, the power source VDD and a transistor T8. A source S8 of the transistor T8 is coupled to the power source VDD; a gate G8 is coupled to an output of the operational amplifier 252; a drain D8 is coupled to a first terminal 264 of a capacitor Cs through a terminal 262; and a second terminal 269 of the Cs is coupled to the ground terminal 246 to provide a direct current ground. In this configuration, a first input terminal 242 of the operational amplifier 252 receives a voltage Vs generated by the replica circuitry 100. A second input terminal 244 of the operational amplifier 252 may be coupled to the drain D8 to receive a voltage generated at the drain D8. In particular, an output swing of the output driver stage 240 is set by the supply voltage Vs. The second power rail circuit 250 of the output driver stage 240 and provides an upper rail output voltage Vs1 at a terminal 262 of the output driver circuit 260. In particular, the voltage defined at the second input terminal 244 and at the drain D8 is equal to Vs. In this configuration, the output voltages Vs1 loops back from the drain D8 of the transistor T8 to the second input terminal 244 of the operational amplifier 252.

The output driver circuit 260 may include transistors T4, T5, T6, T7, and T9. The transistors T4, T5, T6, and T7 are arranged in a cross configuration, as illustrated in FIG. 2, for facilitating current flow through the output driver circuit 260. A source S4 of the transistor T4 is coupled to a drain D5 of the transistor T5, and a gate G4 of the transistor T4 is coupled to the drain D11 of the transistor T11 through the terminal 232. A source S5 of the transistor T5 is coupled to a drain D9 of the transistor T9, and a gate G5 of the transistor T5 is coupled to the drain D12 of the transistor T12 through the terminal 236. A source S9 of the transistor T9 is coupled to a ground terminal 248, and a gate G9 of the transistor T9 receives the voltage Vb from the replica circuitry 100. A source S6 of the transistor T6 is coupled to a drain D7 of the transistor T7, and a gate G6 of the transistor T6 is coupled to the drain D12 and to the gate G5. A source S7 of the transistor T7 is coupled to the drain D9, and a gate G7 of the transistor T7 is coupled to the drain D11 and to the gate G4. In one aspect of the disclosure, the transistor T8 is a PMOS transistor and the transistors T4, T5, T6, T7, and T9 are NMOS transistors.

In this configuration, the transistors T5 and T9 or T7 and T9 of the output driver stage 240 correspond to the transistors T2 and T3 of the replica circuitry 100. The transistors T4 or T6 of the output driver stage 240 also correspond to the transistor T1 of the replica circuitry 100. The voltage mode driver 200 is driven by the replica circuitry 100 such that the impedances of the transistors of the replica circuitry 100 and the corresponding transistors of the voltage mode driver 200 during normal operation are equal or substantially equal, or related by a defined impedance ratio. In particular, the transistor T1 of the replica circuitry 100 is a duplicate or a scaled version of the transistor T4 or T6 in the voltage mode driver 200. Similarly, the transistor T2 and T3 of the replica circuitry 100 are duplicates or scaled versions of the transistors T5 and T9 or T7 and T9 in the voltage mode driver 200. Because matching output impedance is desirable, the output driver stage 240 outputs an impedance equal to the characteristic impedance of the transmission line.

A differential signal is driven into the pre-driver circuit 230 via the differential input terminals, inp 202 and inn 204, and the transistors T11 and T12 are biased according to a switching implementation at the pre-driver stage 210. For, example, a logic low level of the differential input terminals, in a particular logic state, is designed to be low enough to turn off transistors T11 and T12. When the transistor T11 of the pre-driver stage 210 is off, such that the transistor T4 of the output driver stage 240 is also on, the transistor T4 is biased in the same way as the transistor T1 of the replica circuitry 100 (see FIG. 1). During normal operation, the impedance of the transistor T4 is the same as or related by a defined impedance ratio to the impedance of the transistor T1 of the replica circuitry 100. When the transistor T12 of the pre-driver stage 210 is off, such that the transistor T5 and T6 of the output driver stage 240 are also on, the transistor T6 is biased in the same way as the transistor T1 of the replica circuitry 100. During normal operation, the impedance of the transistor T6 is also the same as or related by a defined impedance ratio to the impedance of the transistor T1 of the replica circuitry 100.

In some applications, (e.g., memory physical layer (M-PHY)), the second power rail circuit 250 of the output driver stage 240 may be specified at 200 millivolts (mv) or 400 mv. In the 200 mv application, for example, the current generated by the current sources I1, I2 and I3 in the replica circuitry 100 is set at 100 microamperes. In this configuration, the voltage Vs at terminal 128, second input terminal 120 and second input terminal 126 of the replica circuitry 100 is 200 mv (i.e., 100 microamperes multiplied by the resistance (2 kilo Ohms) at terminal 128). In this configuration, a first input terminal 242 of the operational amplifier 252 receives the voltage Vs (i.e., 200 mv) generated by the replica circuitry 100. Because Vs is equal to Vs1, the voltage at a second input terminal 244 of the operational amplifier 252 is also 200 mv.

As shown in FIG. 2, the current through the output driver circuit 260 is defined by this voltage Vs in combination with the impedance of the transistors of the of the output driver circuit. For example, the impedance of transistor T4 (i.e., 50 Ohms), the impedance of the transistors T7 and T9 (i.e., 50 Ohms), and the impedance of the transmission line (i.e., 100 Ohms, of which 50 Ohms is output impedance and 50 Ohms is input impedance) in combination with the voltage Vs determine the current through the output driver circuit 260. The output driver current may also be determined by the voltage Vs in combination with the impedance of the transistor T6, the impedance of the transistors T5 and T9, and the impedance of the transmission line. The transistor T4 or T6 may be implemented as voltage dividers.

In operation, the input terminals 202 and 204 of the pre-driver circuit 230 of the pre-driver stage toggle between an on state and an off state. As a result, the transistors T11 and T12 of the pre-driver circuit toggle between the on and off state. When the transistor T11 is in the off state, a voltage is generated at the gate G4 of the transistor T4 and the gate G7 of the transistor T7, such that the transistors T4 and T7 are turned on. As a result, current flows from the second power rail circuit 250, through the transistor T4, to the differential output terminal, outn 272, and to the transmission line. The current flows back from the transmission line via the differential output terminal pad, outp 270, through the second output terminal 266, through the transistors T7 and T9, and then to the ground terminal 248. When the transistor T12 is in the off state, a voltage is generated at the gate G5 of the transistor T5 and the gate G6 of the transistor T6 such that the transistors T5 and T6 are turned on. As a result, current flows from the second power rail circuit 250, through the transistor T6 to the output terminal pad, outp 270, through the first output terminal 266 and to the transmission line. The current flows back from the transmission line via the output terminal pad, outn 272, through the second output terminal 268, through the transistors T5 and T9 and then to the ground terminal 248.

In one aspect of the present disclosure, multiple stacked transistors disposed between an output terminal of the voltage mode driver 200, and the power source (e.g., VDD), and/or a ground terminal 248, drive the output terminals of the output driver circuit 260. The stacked transistors may include stacked NMOS transistors. The impedance of the stacked NMOS transistors is biased to 50 Ohms (in this example) to match the impedance characteristics of the transmission line. For example, looking into the output driver stage 240 from a first output terminal 266 to the ground terminal 248, there are two stacked NMOS transistors; namely, transistors T7 and T9. Similarly, two stacked NMOS transistors; T5 and T9 are shown between the second output terminal 268 to the ground terminal 248. The sum of the impedances of the stacked transistors T5 and T9 or T7 and T9, is 50 Ohms (in this example), which matches the impedance characteristics of the transmission line.

Similarly, looking into the output driver stage 240 from the first output terminal 266 to the power source VDD, there are two stacked transistors; namely, NMOS transistor T6 and PMOS transistor T8. In addition, stacked NMOS transistor T4 and PMOS transistor T8 are disposed between the power source VDD and the second output terminal 268. The capacitor Cs includes a first terminal 264 that is coupled to the terminal 262 and a second terminal 269 coupled to the ground terminal 246. As a result, the transistor T4 or T6 is biased, for example to 50 Ohms, to match the impedance characteristic of the transmission line. Therefore, the impedance of the transistor T4 or T6 corresponds to the impedance of the transistor T1 of the replica circuitry 100. Similarly, the transistor T4 is biased to 50 Ohms, to match the impedance characteristic of the transmission line.

Having, stacked transistors T5 and T9 or T7 and T9 between the ground terminal 248 and the output terminal satisfies an electrostatic discharge (ESD) specification by having more than one transistor between the output terminal and the ground terminal 248. For example, if the sum of the impedances of the stacked transistors T2 and T3 is 500 Ohms, then the impedance of the stacked transistors T5 and T9 is 50 Ohms, assuming an impedance ratio of ten (10). This feature of the stacked transistors T5 and T9 also applies to the stacked transistors T7 and T9 based on the switching implementation at the pre-driver stage 210.

Similarly, having, stacked transistors T6 and T8 or transistors T4 and T8 between the power source VDD and the output terminal satisfies the electrostatic discharge (ESD) specification by having more than one transistor between the output terminal and the power source VDD. For example, if the impedance of the transistor T1 is 500 Ohms then the impedance of the transistor T4 is 50 Ohms, assuming an impedance ratio of ten (10). This feature of the transistor T4 also applies to the transistor T6 based on the switching implementation at the pre-driver stage 210.

Figure 3:
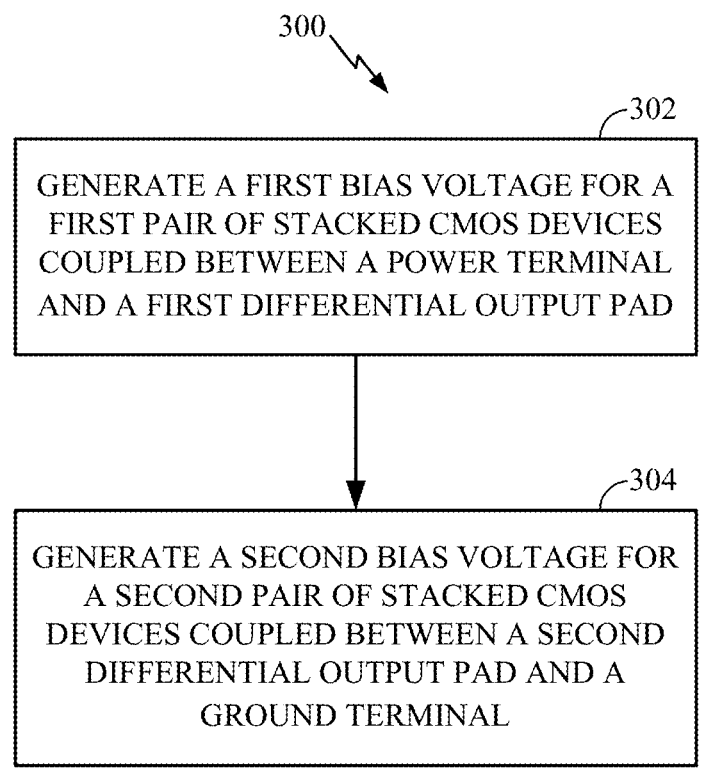
FIG. 3 illustrates a method for operating a voltage-mode driver including stacked NMOS transistors according to an aspect of the present disclosure.

FIG. 3 illustrates a method 300 for implementing a voltage-mode driver including stacked NMOS transistors according to an aspect of the present disclosure. At block 302, the method starts with generating a first bias voltage for a first pair of stacked MOS devices coupled between a power terminal and a first differential output terminal to match a first transmission line characteristic. In the illustration of FIG. 2, the first pair of stacked MOS devices includes the transistors T6 and T8 or T4 and T8. At block 304, the method includes generating a second bias voltage for a second pair of stacked MOS devices coupled between a second differential output terminal and a ground terminal, to match a second transmission line characteristic. In the illustration of FIG. 2, the second pair of stacked MOS devices includes the transistors T5 and T9 or T7 and T9.

In one configuration, the output driver includes a means for generating a first bias voltage and a means for generating a second bias voltage. In one aspect of the disclosure, the first and/or second bias voltage means may be the first power rail circuit 220, the second power rail circuit 250 and/or the pre-driver circuit 230 configured to perform the functions recited by the first and/or second bias voltage means.

In one configuration, the output driver includes first, second, third and fourth means for switching electronic signals. In one aspect of the disclosure, the first, second, third and fourth switching means may be transistors such as transistors T4, T5, T6, T7, T8, and/or T9 of the output driver stage 240 of the voltage mode driver 200 of FIG. 2.

Figure 4:
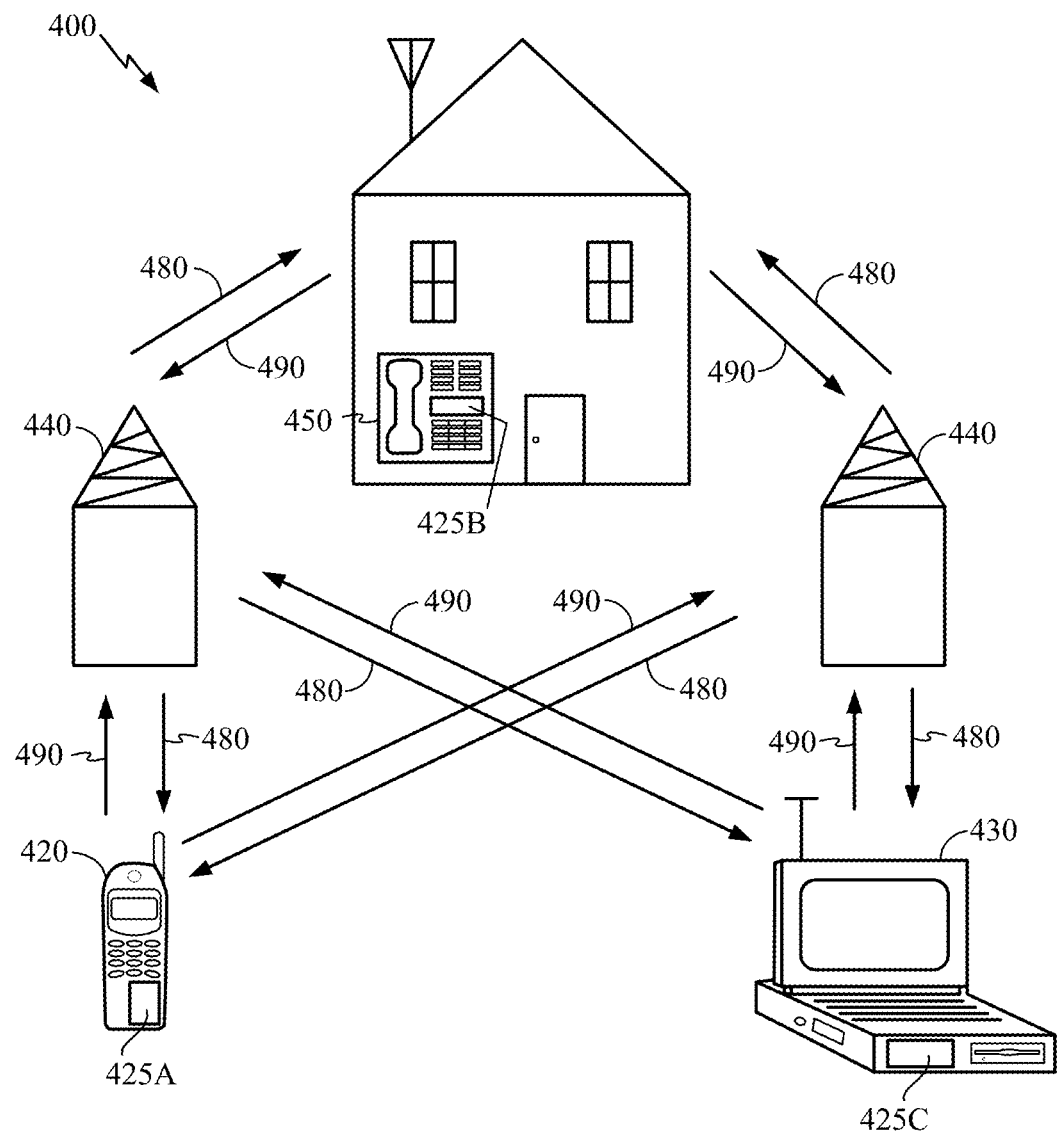
FIG. 4 shows an exemplary wireless communication system in which an aspect of the disclosure may be advantageously employed.

FIG. 4 shows an exemplary wireless communication system 400 in which an embodiment of the voltage-mode driver including stacked NMOS transistors may be advantageously employed. For purposes of illustration, FIG. 4 shows three remote units 420, 430, and 450 and two base stations 440. It will be recognized that wireless communication systems may have many more remote units and base stations. Remote units 420, 430, and 450 include the voltage-mode driver including stacked NMOS transistors 425A, 425B, and 425C. FIG. 4 shows forward link signals 480 from the base stations 440 and the remote units 420, 430, and 450 and reverse link signals 490 from the remote units 420, 430, and 450 to base stations 440.

In FIG. 4, the remote unit 420 is shown as a mobile telephone, remote unit 430 is shown as a portable computer, and remote unit 450 is shown as a fixed location remote unit in a wireless local loop system. For example, the remote units may be cell phones, hand-held personal communication systems (PCS) units, portable data units such as personal data assistants, and/or fixed location data units such as meter reading equipment. Although FIG. 4 illustrates remote units, which may employ a voltage-mode driver including stacked NMOS transistors 425A, 425B, and 425C according to the teachings of the disclosure, the disclosure is not limited to these exemplary illustrated units. For instance, a voltage-mode driver including stacked N-type metal oxide semiconductor field-effect transistors according to embodiments of the present disclosure may be suitably employed in any device.

Figure 5:
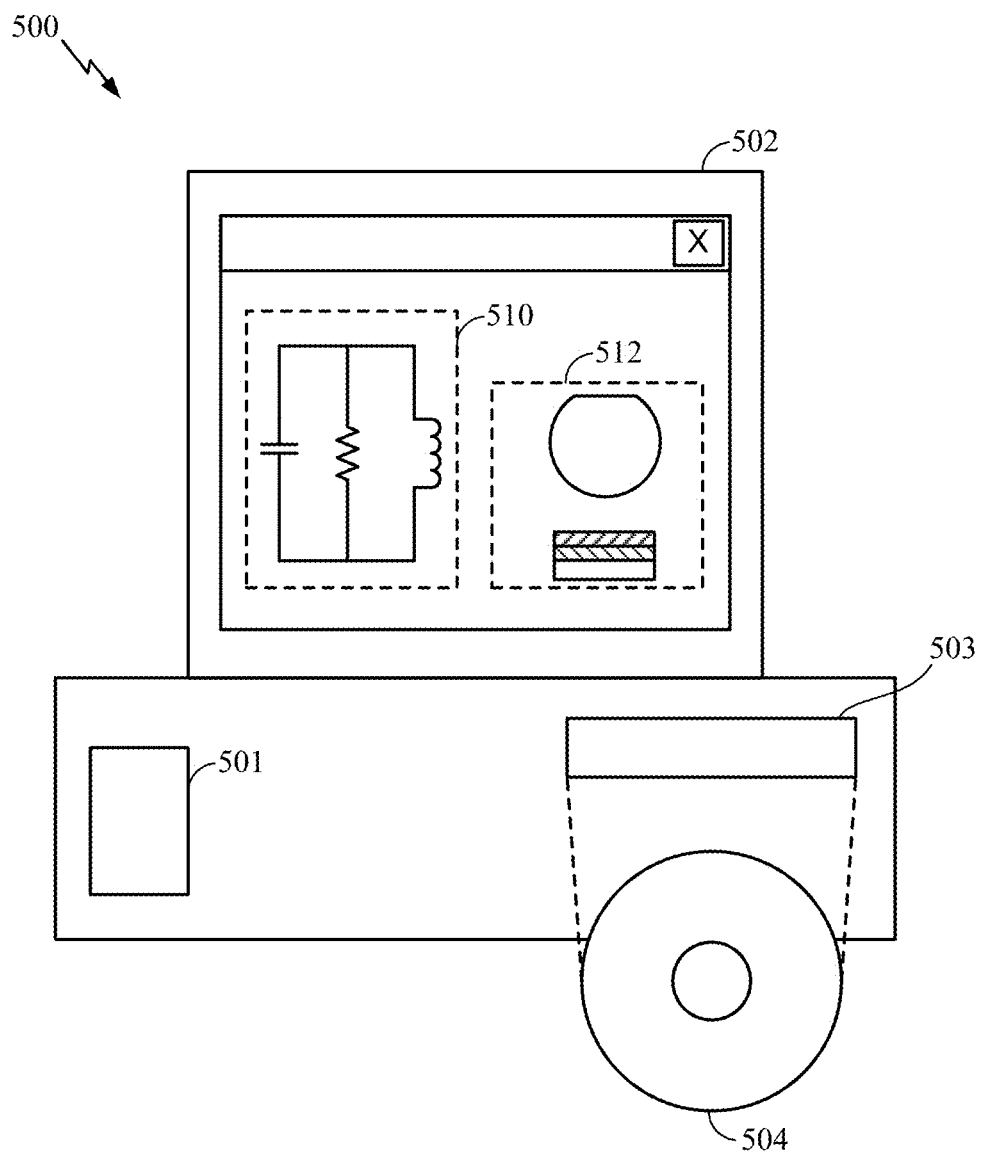
FIG. 5 is a block diagram illustrating a design workstation used for circuit, layout, and logic design of a semiconductor component.

FIG. 5 is a block diagram illustrating a design workstation used for circuit, layout, and logic design of a semiconductor component, such as the voltage-mode driver including stacked NMOS transistors disclosed above. A design workstation 500 includes a hard disk 501 containing operating system software, support files, and design software such as Cadence or OrCAD. The design workstation 500 also includes a display 502 to facilitate design of a circuit 510 or a semiconductor component 512 such as a voltage-mode driver including stacked NMOS transistors. A storage medium 504 is provided for tangibly storing the circuit design 510 or the semiconductor component 512. The circuit design 510 or the semiconductor component 512 may be stored on the storage medium 504 in a file format such as GDSII or GERBER. The storage medium 504 may be a CD-ROM, DVD, hard disk, flash memory, or other appropriate device. Furthermore, the design workstation 500 includes a drive apparatus 503 for accepting input from or writing output to the storage medium 504.

Data recorded on the storage medium 504 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 504 facilitates the design of the circuit design 510 or the semiconductor component 512 by decreasing the number of processes for designing semiconductor wafers.

Although specific circuitry has been set forth, it will be appreciated by those skilled in the art that not all of the disclosed circuitry is required to practice the disclosed embodiments. Moreover, certain well known circuits have not been described, to maintain focus on the disclosure.

The methodologies described herein may be implemented by various means depending upon the application. For example, these methodologies may be implemented in hardware, firmware, software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine or computer readable medium tangibly embodying instructions may be used in implementing the methodologies described herein. For example, software code may be stored in a memory and executed by a processor. When executed by the processor, the executing software code generates the operational environment that implements the various methodologies and functionalities of the different aspects of the teachings presented herein. Memory may be implemented within the processor or external to the processor. As used herein, the term "memory" refers to any type of long term, short term, volatile, nonvolatile, or other memory and is not to be limited to any particular type of memory or number of memories, or type of media upon which memory is stored.

The machine or computer readable medium that stores the software code defining the methodologies and functions described herein includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. As used herein, disk and/or disc includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present teachings and their advantages have been described in detail, it should be understood that various changes, substitutions and alterations can be made herein without departing from the technology of the teachings as defined by the appended claims. Moreover, the scope of the present application is not intended to be limited to the particular aspects of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding aspects described herein may be utilized according to the present teachings. Accordingly, the appended claims are intended to include within their scope such processes, machines, manufacture, compositions of matter, means, methods, or steps.

What is claimed is:

1. An output driver, comprising:
   replica circuitry configured to:
      generate a first bias voltage for biasing first and second replica devices, wherein the first bias voltage sets a defined impedance for the first replica device;
      generate a second bias voltage for biasing a third replica device, wherein the first and second bias voltages set a defined combined impedance for the second and third replica devices, the defined combined impedance being a summation of a first impedance of the second replica device and a second impedance of the third replica device;
   a first pair of metal oxide semiconductor field-effect transistor (MOS) devices coupled between a power terminal and first and second differential output terminals, respectively, wherein a third impedance of one of the first pair of MOS devices is based on the defined impedance of the first replica device in response to the one of the first pair of MOS devices receiving a voltage based on the first bias voltage; and
   a second pair of MOS devices coupled respectively between the first and second differential output terminals and a ground terminal by way of a MOS device, wherein a combined impedance being a summation of a fourth impedance of one of the second pair of MOS devices and a fifth impedance of the MOS device is based on the defined combined impedance in response to the one of the second pair of MOS devices receiving the voltage and the MOS device being biased with the second bias voltage.

2. The output driver of claim 1, in which at least one of the first pair of MOS devices or the second pair of MOS devices comprises an NMOS device.

3. The output driver of claim 1, further comprising a current mode pre-driver operable to supply the voltage to the one of the first pair of MOS device and the one of the second pair of MOS device based on an input differential signal.

4. The output driver of claim 1, in which the replica circuitry is configured to provide a supply voltage to set an output voltage swing across the first and second differential output terminals.

5. The output driver of claim 4, further comprising:
   a voltage rail circuit configured to receive the supply voltage from the replica circuitry.

6. The output driver of claim 1, integrated into a mobile phone, a set top box, a music player, a video player, an entertainment unit, a navigation device, a computer, a handheld personal communication systems (PCS) unit, a portable data unit, and/or a fixed location data unit.

7. The output driver of claim 1, wherein the defined impedance and the defined combined impedance are based on a characteristic impedance of a transmission line coupled to the first and second differential output terminals.

8. The output driver of claim 1, wherein the third impedance is based on a defined impedance ratio multiplied by the defined impedance, and wherein the combined impedance is based on the defined impedance ratio multiplied by the defined combined impedance.

9. A method of operating an output driver, comprising:
   generating a first bias voltage for biasing first and second replica devices, wherein the first bias voltage sets a defined impedance for the first replica device;
   generating a second bias voltage for biasing a third replica device, wherein the first and second bias voltages set a defined combined impedance for the second and third replica devices, the defined combined impedance being a summation of a first impedance of the second replica device and a second impedance of the third replica device;
   applying a voltage based on the first bias voltage to one of a first pair of metal oxide semiconductor field-effect transistor (MOS) devices coupled between a power terminal and first and second differential output terminals, respectively, wherein a third impedance of the one of the first pair of MOS devices is based on the defined impedance of the first replica device;
   applying the voltage to one of a second pair of MOS devices coupled between the first and second differential output terminals and a ground terminal by way of a MOS device; and
   applying the second bias voltage to the MOS device, wherein a combined impedance being a summation of a fourth impedance of the one of the second pair of MOS devices and a fifth impedance of the MOS device is based on the defined combined impedance.

10. The method of claim 9, wherein applying the voltage to the one of the first pair of MOS devices and the one of the second pair of MOS device is based on an input differential signal.

11. The method of claim 9, further comprising:
providing a supply voltage for setting an output voltage swing across the first and second differential output terminals.

12. The method of claim 11, further comprising:
using the supply voltage to generate the first and second bias voltages.

13. The method of claim 9, further comprising integrating the output driver into a mobile phone, a set top box, a music player, a video player, an entertainment unit, a navigation device, a computer, a hand-held personal communication systems (PCS) unit, a portable data unit, and/or a fixed location data unit.

14. The method of claim 9, wherein the defined impedance and the defined combined impedance are based on a characteristic impedance of a transmission line coupled to the first and second differential output terminals.

15. The method of claim 9, wherein the third impedance is based on a defined impedance ratio multiplied by the defined impedance, and wherein the combined impedance is based on the defined impedance ratio multiplied by the defined combined impedance.

16. An output driver, comprising:
means for generating a first bias voltage for biasing first and second replica devices, wherein the first bias voltage sets a defined impedance for the first replica device;
means for generating a second bias voltage for biasing a third replica device, wherein the first and second bias voltages set a defined combined impedance for the second and third replica devices, the defined combined impedance being a summation of a first impedance of the second replica device and a second impedance of the third replica device;
first and second switching means coupled between a power terminal and first and second differential output terminals, respectively, wherein a third impedance of one of the first and second switching means is based on the defined impedance of the first replica device in response to the one of the first and second switching means receiving a voltage based on the first bias voltage; and
third and fourth switching means coupled between the first and second differential output terminals and a ground terminal by way of a MOS device, wherein a combined impedance being a summation of a fourth impedance of one of the third and fourth switching means and a fifth impedance of the MOS device is based on the defined combined impedance in response to the one of the third and fourth switching means receiving the voltage and the MOS device being biased with the second bias voltage.

17. The output driver of claim 16, further comprising means for supplying the voltage to the one of the first and second switching means and the one of the third and fourth switching means based on an input differential signal.

18. The output driver of claim 16, further comprising means for providing a supply voltage to set an output voltage swing across the first and second differential output terminals.

19. The output driver of claim 16, integrated into a mobile phone, a set top box, a music player, a video player, an entertainment unit, a navigation device, a computer, a hand-held personal communication systems (PCS) unit, a portable data unit, and/or a fixed location data unit.

20. The output driver of claim 16, wherein the defined impedance and the defined combined impedance are based on a characteristic impedance of a transmission line coupled to the first and second differential output terminals.

21. The output driver of claim 16, wherein the third impedance is based on a defined impedance ratio multiplied by the defined impedance, and wherein the combined impedance is based on the defined impedance ratio multiplied by the defined combined impedance.

* * * * *